US005481153A

United States Patent [19]

Turner

[11] Patent Number: 5,481,153

[45] Date of Patent: Jan. 2, 1996

[54] ACOUSTIC NON-DESTRUCTIVE TESTING

[75] Inventor: Charles W. Turner, Virginia Water, England

[73] Assignee: British Technology Group Ltd., London, England

[21] Appl. No.: 244,550

[22] PCT Filed: Dec. 4, 1992

[86] PCT No.: PCT/GB92/02253

§ 371 Date: Aug. 22, 1994

§ 102(e) Date: Aug. 22, 1994

[87] PCT Pub. No.: WO93/11528

PCT Pub. Date: Jun. 10, 1993

[30] Foreign Application Priority Data

Dec. 6, 1991 [GB] United Kingdom .................. 9126082

[51] Int. Cl.[6] .................................................. H01L 41/08

[52] U.S. Cl. ........................................... 310/334; 310/327

[58] Field of Search .................................. 310/326, 327, 310/334, 336; 73/642, 644, 649

[56] References Cited

U.S. PATENT DOCUMENTS

| | | | |
|---|---|---|---|
| Re. 29,785 | 9/1978 | Leschek et al. | 310/327 |
| 2,700,738 | 1/1955 | Havens | 310/327 X |
| 3,553,501 | 1/1971 | Thill | 310/327 |
| 3,928,777 | 12/1975 | Massa | 310/334 |
| 4,030,175 | 6/1977 | McShane | 29/25.35 |
| 4,410,825 | 10/1983 | Lobastov | 310/327 |
| 4,751,420 | 6/1988 | Gebhardt et al. | 310/327 |
| 4,755,708 | 7/1988 | Granz et al. | 310/334 X |
| 5,176,140 | 1/1993 | Kami et al. | 310/327 X |

OTHER PUBLICATIONS

Journal of the Acoustic Society of America, vol. 71, No. 5, May 1982, New York, USA, pp. 1163–1168 Thomas Proctor, Jr. "The improved Piezoelectric Acoustic Emission Transducer" see the whole document.

*Primary Examiner*—Mark O. Budd
*Attorney, Agent, or Firm*—Cushman, Darby & Cushman

[57] ABSTRACT

An acoustic probe comprising a piezoelectric ceramic transducer element energizable to emit ultrasonic signals in a first direction and in a second direction opposite to the first, and mountable on a sample to be tested so as to transmit thereto signals emitted in the said first direction, is further provided, according to the invention, with a rod-shaped acoustic waveguide having one end coupled to the transducer element to receive signals emitted by the transducer element in the said second direction and to transmit them along the waveguide, with lossy cladding material acoustically coupled to the surface of the waveguide at least at a part thereof remote from its one end, and with coupling means surrounding and mechanically secured and acoustically coupled to the ceramic element and the said one end of the waveguide, the coupling means having a surface adapted to be secured to the sample to be tested and to transmit thereto signals emitted by the transducer element.

8 Claims, 2 Drawing Sheets

ACOUSTIC NON-DESTRUCTIVE TESTING

BACKGROUND OF THE INVENTION

1. Field of the Invention

This invention relates to the non-destructive testing of materials, and in particular of materials such as concrete which are essentially non-homogeneous and which, at conventional ultrasound frequencies, would produce such a high degree of scattering that commonly used ultrasound techniques are not suitable.

2. Related Art

Ultrasound frequencies used in non-destructive testing of materials and in medical investigations are commonly greater than 1 MHz, whereas in highly scattering media only relatively low frequencies, below 1 MHz in any event and, in the case of concrete for example, preferably below 500 KHz, can be used. At these lower frequencies plane wave transducers would need to be unreasonably large and, moreover, when detecting incoherent waves produced in scattering media would be subject to phase cancellation effects. Hence new techniques and devices are required which are suitable for use in connection with scattering media; and it is an object of the present invention to provide an effectively point-source transmit/receive transducer suitable for such applications and, preferably, capable of wideband operation and suitable for short pulse or chirp operation, at low-ultrasound frequencies.

SUMMARY OF THE INVENTION

According to the invention there is provided an acoustic probe comprising a piezoelectric ceramic transducer element adapted to emit ultrasonic signals in a first direction and in a second direction opposite to the first, and mountable on a sample to be tested so as to transmit thereto signals emitted in the said first direction, wherein the probe also includes a rod-shaped acoustic waveguide having one end coupled to the transducer element to receive signals emitted by the transducer element in the said second direction and to transmit them along the waveguide, lossy cladding material acoustically coupled to the surface of the waveguide at least at a part thereof remote from its one end, and coupling means surrounding and mechanically secured and acoustically coupled to the ceramic element and the one end of the waveguide, the coupling means having a surface adapted to be secured to the sample to be tested and to transmit thereto signals emitted by the transducer element.

In preferred embodiments of the invention, in which the transducer element has the shape of a circular disc and the rod-shaped waveguide is also of circular cross-section and is arranged co-axial with the transducer element, the diameter of the waveguide is in the range 50% to 10% greater than that of the transducer element.

Preferably, also, the transducer element is partially set into a recess in the one end of the waveguide and partially projects therefrom, and the coupling means is a collar which surrounds and is mechanically secured and acoustically coupled to the one end of the waveguide and the part of the transducer element which projects therefrom.

In certain embodiments of the invention, the coupling means and the lossy cladding material together cover the whole of the exterior surface of the waveguide. In other embodiments, part of the length of the waveguide is free of cladding and a second transducer element is provided within the waveguide or spaced ring-shaped piezoelectric transducers are provided surrounding and acoustically coupled to that part of the waveguide.

BRIEF DESCRIPTION OF THE DRAWINGS

The invention is described and explained more fully with reference to the accompanying drawings in which.

DETAILED DESCRIPTION OF THE PRESENTLY PREFERRED EMBODIMENTS

Figure 1:
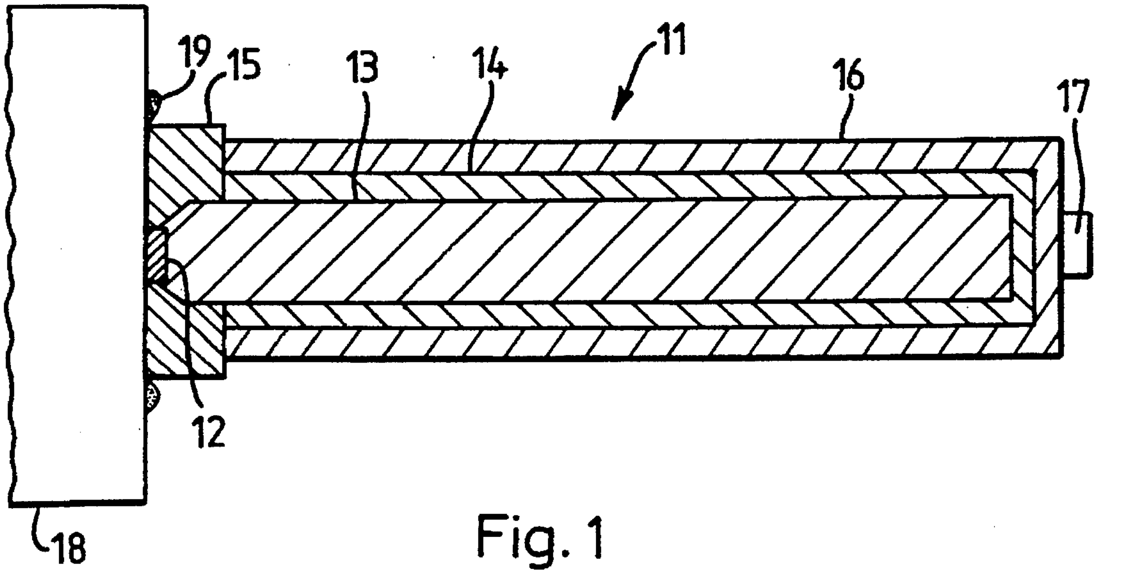
FIG. 1 is a diagrammatic longitudinal sectional view of a first embodiment of an acoustic waveguide probe according to the invention, secured in position on a surface of a sample under test.
Figure 2:
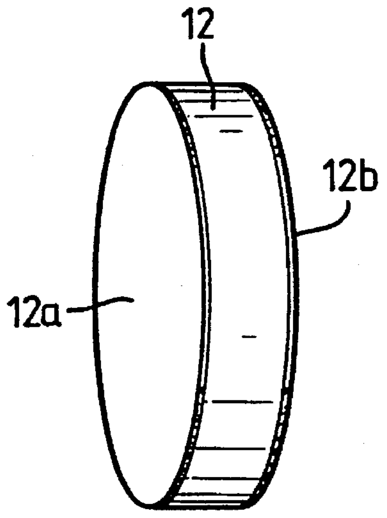
FIG. 2 is a perspective view, on a larger scale, of a piezoelectric ceramic transducer element comprised by the probe shown in FIG. 1.

The probe shown in FIG. 1 is indicated generally by the reference 11 and comprises a piezoelectric transducer element 12 which is preferably, as shown in FIG. 2, in the shape of a circular disc and may be of lead zirconate titanate (PZT) ceramic, known commercially as PC5 or PZT5, with its two circular end faces 12*a* and 12*b* surface-coated in any convenient manner with silver to form electrically conductive electrodes. On energization of the element 12 by applying a voltage at a suitable ultrasonic frequency between its electrodes 12*a* and 12*b*, it emits ultrasonic signals in a first direction, from its face 12*a* and normal thereto, and in a second, opposite, direction from its face 12*b*. The element 12, of which the diameter and thickness may typically be in the ranges 5–10 mm and 2–10 mm, respectively, is set partially into one end of an acoustic waveguide in the form of a cylindrical rod 13 having a length which may typically be between 100 and 500 mm and whose diameter may be some 50% to 70% greater than that of the disc 12. The rod 13 is formed at its one end with a tapered section 13*a* and with a circular axial recess 13*b* in which the face 12*b* and about 50% to 70% of the thickness of the disc 12 are accommodated, with the disc in close physical contact and acoustically well coupled with the material of the rod 13. Cylindrical rod waveguides are available in many forms and materials, and the rod 13 is such that its acoustic impedance is a good match for that of the disc 12. For example, if the acoustic impedance of the disc 12 is 33 MRayls, the rod 13 may conveniently be made of brass, which has a similar acoustic impedance. As a result of this and the good acoustic coupling with the disc 12, the rod 13 efficiently receives signals emitted in the second direction from the rear face 12*b* of the disc and thus provides excellent loading for the rear face 12*b* of the disc, so that very broad bandwidth operation of the disc 12 as an acoustic transducer element can be achieved.

For absorbing acoustic energy of the waveguide 13, its outer surface is provided with a cladding 14 of an acoustically lossy material, and is preferably Knurled or grooved or otherwise roughened to provide good coupling to this material. A very suitable material for the cladding 14 is that available under the name "PLASTICINE" (Registered Trade Mark), which provides good wideband absorption of energy launched into the waveguide and of spurious reflections, and improves the axial resolution of the signals launched from the front face 12*a* of the disc 12 into a sample under test (as further described below).

Surrounding the disc 12 and the end 13*a* of the waveguide 13, the probe 11 is provided with coupling means in the form of a collar 15 which facilitates attachment of the probe to the surface of a sample to be tested and provides good acoustic coupling to the sample. The collar 15, which may as illustrated have an end face flush with the face 12*a* of the disc 12, thus leaving the face 12*a* exposed, or which may cover the face 12*a* so as to give it added protection, may be made of epoxy resin and hardener admixed with mineral powder such as alumina powder, so as to obtain a good acoustic match to a concrete sample which is to be tested. The remainder of the waveguide 13 and its cladding 14 are enclosed in a protective surrounding sheath 16 which provides both mechanical protection and electromagnetic shielding. Mounted on the sheath 16 is a terminal connector 17 giving access to internal electrical connections 17*a* and 17*b* (shown diagrammatically in FIG. 3) to the two electrodes constituted by the metallized faces 12*a* and 12*b* of the piezoelectric element 12.

In use, as shown in FIG. 1, the probe 11 is attached to a surface of a sample 1B, which is to be tested, by pressing the free end face of the collar 15 against the surface after first applying a layer of fast-setting mortar 19. The mortar may conveniently be that known and available commercially as "Renderoc Plug 1", which hardens, in two or three minutes after being mixed with water, into a brittle solid with an acoustic impedance similar to that of concrete and of the collar 15, so as to provide good acoustic coupling with little reflection at interfaces. The collar 15 may have a diameter several times that of the waveguide 13, and thus provides a good mechanical mount in addition to good acoustic coupling.

Figure 3:
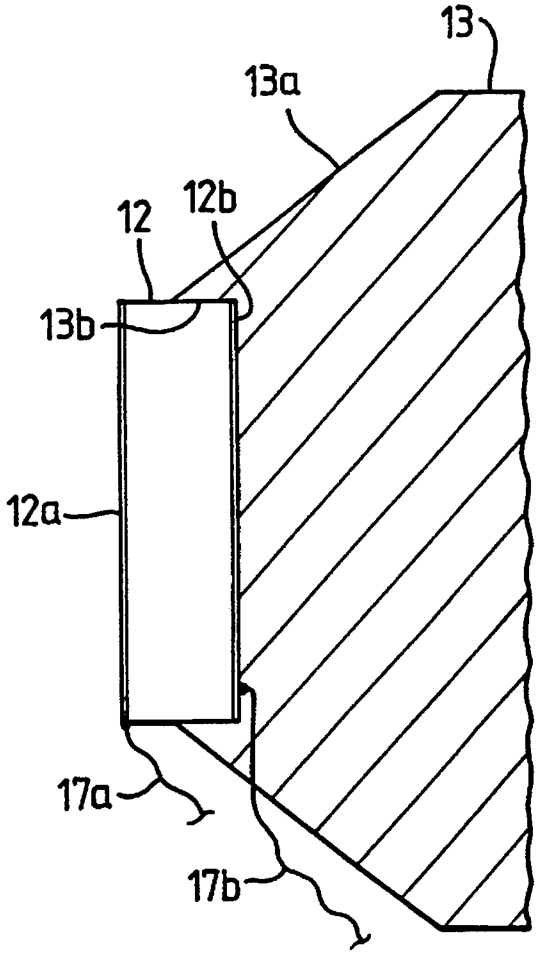
FIG. 3 is a scrap sectional view, also on a larger scale, showing the mounting of the transducer element in relation to an acoustic waveguide comprised by the probe shown in FIG. 1.

The probe shown in FIGS. 1 to 3 and described above has, by proper choice of the probe materials, good mechanical and acoustic coupling to a sample to be tested, with very little reflection of the signal emitted, in a first direction, to the sample from the front face 12*a* of the element 12 and the surrounding collar 15, and almost complete absorption, by the cladding 14, of the emission in a second, opposite, direction from the rear face 12*b* of the element 12 into the waveguide 13. The probe can therefore be used satisfactorily at frequencies throughout the range of interest, namely 50 KHz to 500 KHz, which makes it suitable for broad band operation, including the use of short pulse and FM chirp signal techniques. This suitability for wideband operation arises partly from the non-resonant character of the piezoelectric element 12, partly from its being carefully impedance-matched with the waveguide rod 13, and partly because of the arrangement whereby a single propagation mode is excited in the waveguide, which allows the rod to be terminated in a perfectly matched wideband manner by the lossy cladding 14 which accordingly eliminates reverberant echoes and other spurious modes.

The aperture of the probe, as it is applied to the sample to be tested, is less than a wavelength at the frequencies at which it is to be operated, and it is therefore suitable for use as an effectively point-source probe. It Is thus ideal for receiving incoherent wave fronts from the scattering medium, because no phase cancellation effects can occur If the aperture is less than a wavelength, and It can also be incorporated in an array or developed into a variety of novel geometries. The fact that the probe is so effectively damped by its lossy cladding, even at low ultrasonic frequencies, means that it is capable of very wideband operation and can be made to emit very short pulses, say only one or two cycles in length, or wideband FM chirp signals.

Figure 4:
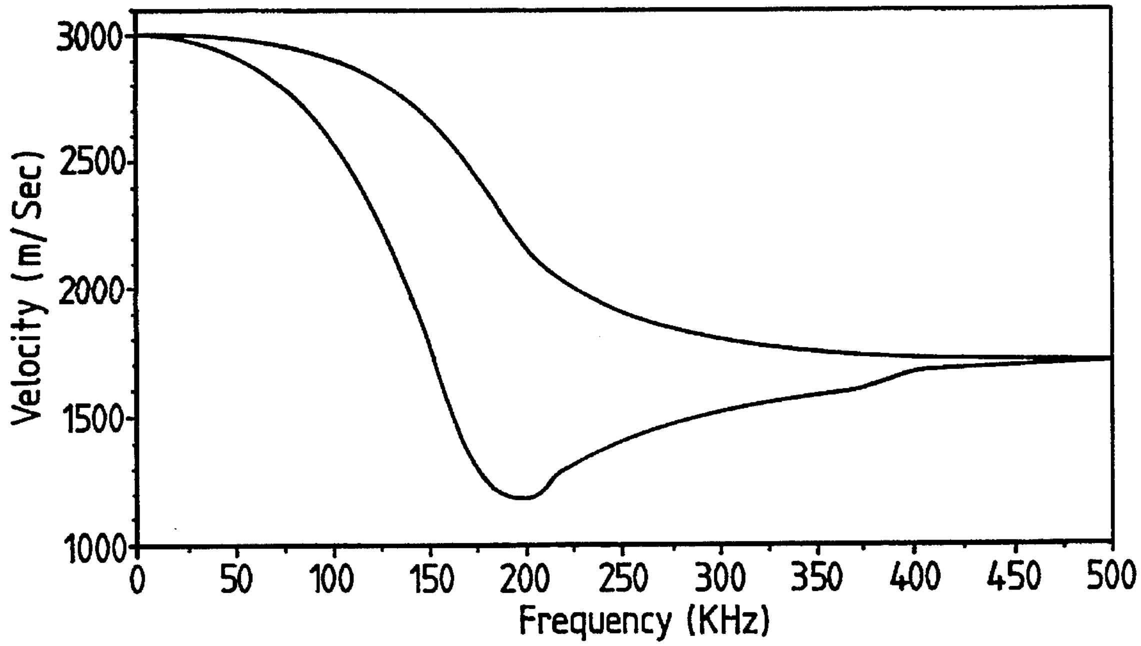
FIG. 4 shows acoustic velocity and dispersivity characteristics of the probe.
Figure 5:
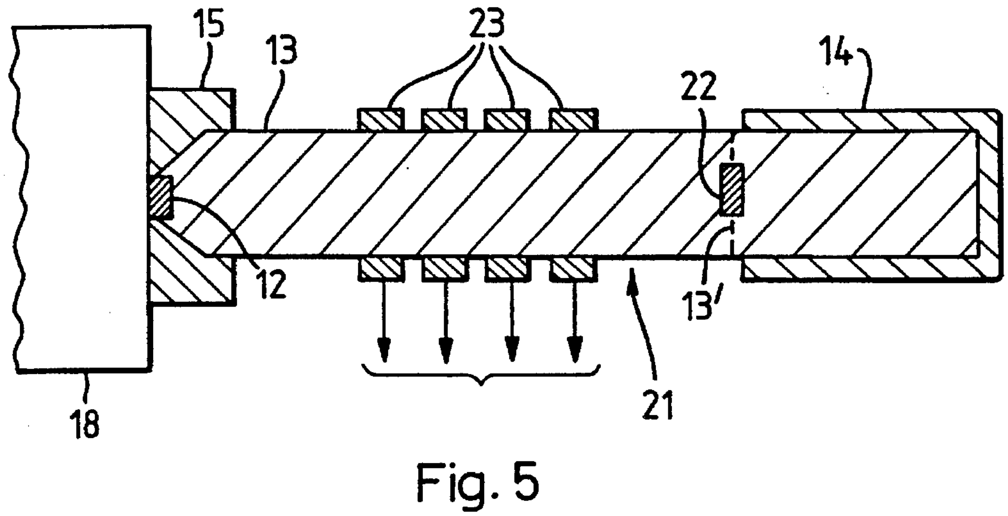
FIG. 5 is a diagrammatic longitudinal sectional view of a second embodiment of an acoustic waveguide probe according to the invention.

The inherently dispersive character of the rod waveguide is shown in FIG. 4, which shows how phase velocity (upper curve) and group velocity (lower curve) of a wave propagated along such a waveguide in the lowest longitudinal symmetrical $S_o$ mode vary with frequency over the range up to 500 KHz. This enables a probe according to the invention to be used in synthesizing a transversal matched filter type of signal processor with FM Chirp waveforms, such as the matched pulse-compression filter, as shown in FIG. 5. As shown in FIG. 5, a probe 21 comprises (like the probe 11 shown in FIG. 1) a ceramic piezoelectric element 12, an impedance matched solid-rod waveguide 13 with external lossy cladding 14, and a collar 15 for mounting the probe on a sample 18 with the help of quick-setting mortar and for coupling the probe acoustically to the sample. In this embodiment, the lossy cladding 14 is applied only to a part of the rod 13 which is remote from the sample, though the cladding is arranged still to be sufficient to provide the waveguide with an adequate termination which absorbs substantially all the ultrasonic energy impinging on it. Embedded in the waveguide 13, at or before the point along its length at which the cladding 14 commences, is a second ceramic piezoelectric element, 22, which may be identical in its construction with the element 12. In practice the waveguide 13 may be constructed in two portions with respective end faces abutting one another in a plane 13' and recessed to accommodate the element 22 between them with good acoustic coupling and with suitable electrical insulation of the element and its electrical connections. The transducer element 12 may then be used to apply a signal to the sample 1B, the reflected signal which returns to the collar 15 being then transmitted along the rod 13 to be sensed and converted into an electrical output signal by the transducer element 22. Because of the dispersive character of the waveguide, as illustrated by FIG. 4, the signal transit time along It to the element 22 is frequency-dependent, and this can be used to advantage in known manner in processing the received reflected signals following excitation by multi-frequency signals such as FM Chirp signals.

As an alternative to the transducer element 22, the waveguide 13 may have, spaced along its length, a plurality of ring-shaped piezoelectric elements 23 which respond to radial oscillating expansions and contractions of the waveguide rod, with frequency-dependent delays between their output signals due to the frequency-dependent propagation velocity of signals along the rod 13.

As in the probe shown in FIG. 1, the transducer element 12 may itself be used both to transmit and to receive, in cases where it is not desired to take advantage of the dispersive character of the waveguide 13.

What is claimed is:

1. An acoustic probe comprising:

a piezoelectric ceramic transducer element, energizable to emit ultrasonic signals in a first direction and in a second direction opposite to said first direction, and mountable on a sample to be tested so as to transmit thereto signals emitted in said first direction, a rod-shaped acoustic waveguide having one end coupled to said transducer element to receive signals emitted by said transducer element in said second direction and to transmit said signals along said waveguide, lossy cladding material acoustically coupled to a surface of said waveguide at least at a part of said waveguide remote from said one end, and coupling means surrounding and mechanically secured and acoustically coupled to said transducer element and said one end of the waveguide, said coupling means having a surface adapted to be secured to the sample to be tested and to transmit thereto signals emitted by the transducer element, wherein said waveguide includes a recess at said one end and said transducer element includes a part that is partially set into said recess and a part that partially projects therefrom, and wherein said coupling means is a collar that surrounds and is mechanically secured and acoustically coupled to said one end of said waveguide and said part of said transducer projecting from said recess.

2. An acoustic probe as claimed in claim 1, wherein said transducer element is shaped like a circular disc, and said rod-shaped waveguide is of circular cross-section and is arranged coaxial with said transducer element, and said waveguide has a diameter in the range of from 50% to 70% greater than a diameter of said transducer element.

3. An acoustic probe as claimed in claim 1, wherein said coupling means is formed from epoxy resin and hardener, with an admixture of one of alumina powder and other mineral powder.

4. An acoustic probe as claimed in claim 1, wherein said lossy cladding material is "PLASTICINE".

5. An acoustic probe as claimed in claim 1, wherein said waveguide includes an exterior surface entirely covered by said coupling means and said lossy cladding material.

6. An acoustic probe as claimed in claim 1, wherein a remote end of said waveguide remote from said one end is clad with said lossy cladding material but a part of a length of said waveguide, between said coupling means and said remote end, is unclad.

7. An acoustic probe as claimed in claim 6, wherein a second transducer element is provided within the waveguide, remote from said one end but in that part of said length which is unclad, said second transducer element adapted to receive ultrasonic signals transmitted along said waveguide from said one end.

8. An acoustic probe as claimed in claim 6, wherein said waveguide includes a plurality of ring-shaped piezoelectric transducer elements sensitive to oscillatory radial expansions and contractions of said waveguide spaced along that part of said length that is unclad at locations remote from said one end.

* * * * *